(12) United States Patent
Zou (10) Patent No.: US 10,153,226 B1
(45) Date of Patent: Dec. 11, 2018

(54) HEAT DISSIPATING DEVICE

(71) Applicant: Haoxiong Zou, Guangdong (CN)

(72) Inventor: Haoxiong Zou, Guangdong (CN)

( * ) Notice: Subject to any disclaimer, the term of this patent is extended or adjusted under 35 U.S.C. 154(b) by 0 days.

(21) Appl. No.: 15/814,365

(22) Filed: Nov. 15, 2017

(30) Foreign Application Priority Data

Oct. 13, 2017 (CN) .......................... 2017 1 0953868

(51) Int. Cl.
*F28D 1/00* (2006.01)
*H01L 23/467* (2006.01)
*F28D 15/02* (2006.01)
*H01L 23/427* (2006.01)
*H05K 7/20* (2006.01)
*G06F 1/20* (2006.01)

(52) U.S. Cl.
CPC ........ *H01L 23/467* (2013.01); *F28D 15/0275* (2013.01); *H01L 23/427* (2013.01); *G06F 1/203* (2013.01); *H05K 7/20154* (2013.01); *H05K 7/20445* (2013.01)

(58) Field of Classification Search
CPC ... F28D 15/0275; H01L 23/0467; F25B 21/02
See application file for complete search history.

(56) References Cited

U.S. PATENT DOCUMENTS

| 2008/0098750 | A1* | 5/2008 | Busier ...................... F24H 4/04 62/3.3 |
| 2008/0105407 | A1* | 5/2008 | Yeh ........................ H01L 23/467 165/104.28 |
| 2012/0055654 | A1* | 3/2012 | Katsumata .............. F28D 1/047 165/121 |
| 2016/0234968 | A1* | 8/2016 | Huang ................... H01L 23/427 |
| 2017/0055372 | A1* | 2/2017 | Ahamed ............. F28D 15/0233 |
| 2017/0307299 | A1* | 10/2017 | Huang ..................... F28D 15/02 |

FOREIGN PATENT DOCUMENTS

CN  205644413  10/2016

* cited by examiner

*Primary Examiner* — Brian M King (57) ABSTRACT

A heat dissipating device including a base including a heat absorbing plate made of a metallic material and configured for an electronic product to be placed thereon; a heat absorbing plate flow channel is disposed within the heat absorbing plate and is configured for a cooling medium to flow through; a heat dissipating main body connected to the base; wherein the heat dissipating main body includes a housing, and a first heat dissipator and a heat dissipating fan disposed within the housing; the first heat dissipator includes a first heat dissipating substrate; a first heat dissipating flow channel, configured for the cooling medium to flow through, is disposed within the first heat dissipating substrate; the heat absorbing plate flow channel and the first heat dissipating flow channel are connected via pipes and form a cooling medium circulation loop; and a fluid pump is disposed in the cooling medium circulation loop.

9 Claims, 10 Drawing Sheets

HEAT DISSIPATING DEVICE

CROSS REFERENCE TO RELATED APPLICATION

The present application claims the benefit of Chinese Patent Application No. 201710953868.7 filed on Oct. 13, 2017, the content of which is hereby incorporated by reference.

FIELD OF TECHNOLOGY

The present application relates to a heat dissipating device, and more particularly, to a heat dissipating device for electronic products.

BACKGROUND

On one hand, electronic products such as mobile phones, tablets, and laptops have become lighter and thinner, and fanless designs have been adopted in more and more of them. On the other hand, the performance of the electronic products, as well as the number of cores in the internal central processing units (CPUs) and graphics processor units (GPUs) of the electronic products, has been increasing and the frequencies of the internal CPUs and GPUs are becoming higher and higher. This trend results in greater heat generation, which brings along a great challenge to the design of heat dissipating units of the electronic products. Although metal case has been adopted by more electronic product where heat is dissipated with the assistance of the metal case, lags and crashes caused by overheating still occur when games or other software that require much computation are run. This would lead to very unpleasant user experience. In order to facilitate heat dissipation of the electronic products, some auxiliary heat dissipating devices such as heat dissipating bases in which a fan is adopted to air-cool the electronic products are available. However, such heat dissipating bases have low heat dissipating efficiency and are only effective at low ambient temperature.

SUMMARY

The objective of the present application is to provide a heat dissipating device for an electronic product. Such a heat dissipating device may facilitate heat dissipation of the electronic product at even higher efficiency, and enhance user experience.

In one embodiment of a heat dissipating device according to the present application, the heat dissipating device includes:
a base that includes a heat absorbing plate; wherein the heat absorbing plate is made of a metallic material and is configured for an electronic product to be placed thereon; wherein a heat absorbing plate flow channel is disposed within the heat absorbing plate and is configured for a cooling medium to flow through;
a heat dissipating main body that is connected to the base; wherein the heat dissipating main body includes a housing, a first heat dissipator, and a heat dissipating fan disposed within the housing; the first heat dissipator includes a first heat dissipating substrate; a first heat dissipating flow channel, configured for the cooling medium to flow through, is disposed within the first heat dissipating substrate; wherein the heat absorbing plate flow channel and the first heat dissipating flow channel are connected via pipes and form a cooling medium circulation loop; and a fluid pump is disposed in the cooling medium circulation loop.

In one embodiment of the heat dissipating device according to the present application, the heat dissipating main body further includes a second heat dissipator disposed within the housing; the second heat dissipator includes a solid-state refrigerating member, and a cooling plate disposed at a cool terminal of the solid-state refrigerating member; a cooling plate flow channel, configured for the cooling medium to flow through, is disposed within the cooling plate; and the cooling plate flow channel forms a part of the cooling medium circulation loop.

In one embodiment of the heat dissipating device according to the present application, the second heat dissipator further includes a second heat dissipating substrate disposed at the hot terminal of the solid-state refrigerating member; and a side of the second heat dissipating substrate, which is distal from the hot terminal of the solid-state refrigerating member 41, includes heat dissipating fins.

In one embodiment of the heat dissipating device according to the present application, the solid-state refrigerating member is a semiconductor refrigerating member, a refrigerating member based on magnetocaloric effect, or a refrigerating member based on thermoelectric effect.

In one embodiment of the heat dissipating device according to the present application, heat dissipating fins are formed on a side of the first heat dissipating substrate.

In one embodiment of the heat dissipating device according to the present application, the heat dissipating device further includes a solid-state refrigerating member; wherein a cool terminal of the solid-state refrigerating member is fitted with the first heat dissipating plate.

In one embodiment of the heat dissipating device according to the present application, a container is disposed in the cooling medium circulation loop, and the container is configured for accommodating the cooling medium.

In one embodiment of the heat dissipating device according to the present application, the base further includes a bottom case disposed beneath the hot absorbing plate; and the fluid pump and the container are disposed within the bottom case.

In one embodiment of the heat dissipating device according to the present application, an air inlet and an air outlet are formed on the housing; and the heat dissipating fan is configured to draw in air via the air inlet and emit the air via the air outlet.

In one embodiment of the heat dissipating device according to the present application, the base and the heat dissipating main body are connected via a conduit.

Implementation of the heat dissipating device according to the present application possesses the following advantageous effects:
By using the cooling medium circulation loop formed by the heat absorbing plate and the first heat dissipating substrate within the heat dissipating main body, the heat dissipating device according to the present application possesses a higher heat dissipation efficiency and may improve the user experience.

BRIEF DESCRIPTION OF THE DRAWINGS

The heat dissipating device according to the present application will be described in further detail with reference to the accompanying drawings and embodiments. In the drawings:

FIG. 6b is a schematic view of the structure of the first heat dissipator shown in FIG. 6a.

FIG. 7b is a schematic view of the solid-state refrigerating member and the cooling plate in the second heat dissipator shown in FIG. 7a.

FIG. 7c is a schematic view of the structure of the solid-state refrigerating member and the cooling plate in the second heat dissipator shown in FIG. 7a.

DETAILED DESCRIPTION

For a clear understanding of the technical features, objectives and effects of the heat dissipating device according to the present application, specific embodiments of the present application will now be described in detail with reference to the accompanying drawings.

Embodiments of the heat dissipating device according to the present application are described in detail below, examples of which are shown in the accompanying drawings. Among them, like or similar reference numerals refer to like or similar elements, or elements having the same or similar functions, throughout the following description.

In the description of the heat dissipating device according to the present application, it should be understood that the orientations or positional relationships indicated by terms such as "front", "rear", "above", "below", "upper end", "lower end", "upper portion" and "lower portion" are based on the orientations and positional relationships shown in the drawings, which are solely for the convenience in describing the heat dissipating device according to the present application and simplifying the description. These terms do not indicate or imply that the device or elements referred to must have a specific orientation, or be constructed and operated in a specific orientation. Therefore, these terms should not be interpreted as limitations of the present application. In addition, terms such as "first" and "second" are for illustrative purpose only and should not be interpreted as indicating or implying the relative importance.

FIGS. 1-4 show the schematic views of an embodiment of the heat dissipating device according to the present application. The heat dissipating device may be used for dissipating heat of an electronic product, particularly an electronic product with a metal case (e.g. a tablet or a laptop having a metal case). Referring to FIGS. 1-5, in the present embodiment, the heat dissipating device may include a base 1. The base 1 may include a heat absorbing plate 10 made of a metallic material for placing the electronic product. A heat absorbing plate flow channel 101 for a cooling medium to flow through may be disposed within the heat absorbing plate 10. A cooling medium inlet 102 and a cooling medium outlet 103, in connection with the heat absorbing plate flow channel 101, respectively, may be disposed on the heat absorbing plate 10. Preferably, the heat absorbing plate 10 may be made of a metal with good thermal conductivity, e.g. copper, copper alloy, aluminum, aluminum alloy or other metallic or alloy materials. Preferably, the cooling medium may be a fluid with a relatively large specific heat capacity, e.g. water, or a mixture of water and other substances. The cooling mixture may also be oil or a mixture of oil, with relatively large specific heat capacity and relatively high fluidity. When the cooling medium having a relatively low temperature enters the heat absorbing plate 10 via the cooling medium inlet 102, it flows through the heat absorbing plate flow channel 101 and flows out via the cooling medium outlet 103. Heat exchange may occur between the cooling medium and the heat absorbing plate 10, and the heat may be carried away by the cooling medium. The heat absorbing plate flow channel 101 may be of different forms. The heat absorbing plate flow channel may be a plurality of parallel flow channels, a labyrinth type flow channel, a micro-channel type flow channel, or any other types of conventionally applicable flow channel. The electronic product with higher level of heat generation may be placed directly on the heat absorbing plate 10, and the heat absorbing plate 10 may contact a portion of the electronic product having a higher temperature. For instance, the bottom metal case of a laptop may be placed directly on the heat absorbing plate 10. The heat generated during operation of the laptop may be transferred to the heat absorbing plate 10 via the bottom metal case, and then carried away by the cooling medium flowing through the heat absorbing plate flow channel 101 of the heat absorbing plate 10, thereby achieving the effect of lowering the temperature of the laptop. The base 1 may further include a bottom case 13 disposed beneath the heat absorbing plate 10. The bottom case 13 may raise the heat absorbing plate 10 by a certain height in order to facilitate heat dissipation of the heat absorbing plate 10 outwardly. Moreover, the bottom case 13 may possess a storage space for storing other parts, so that the other parts of the heat dissipating device may be placed therein.

Figure 1:
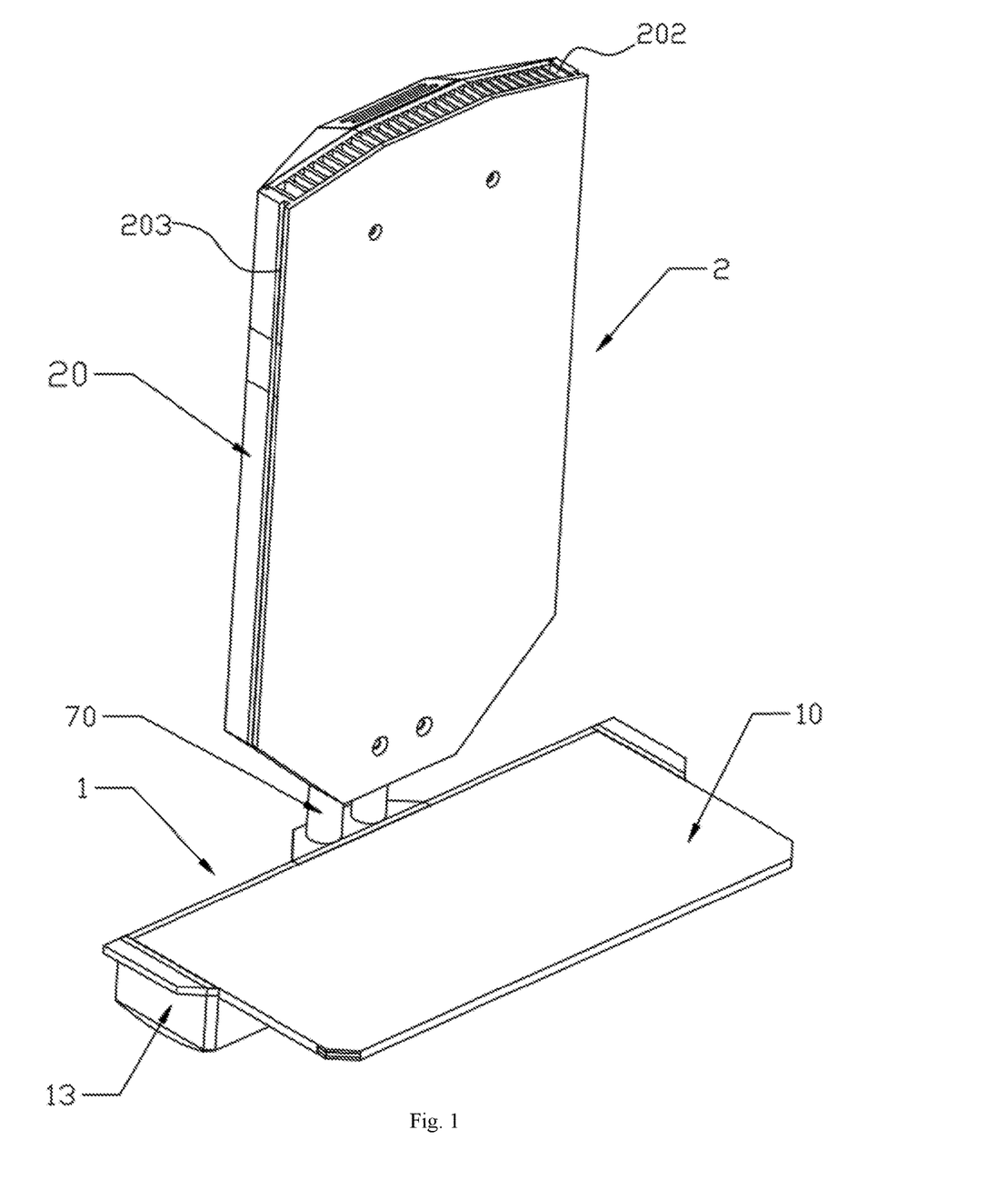
FIG. 1 is a three-dimensional schematic view of an embodiment of the heat dissipating device according to the present application.
Figure 2:
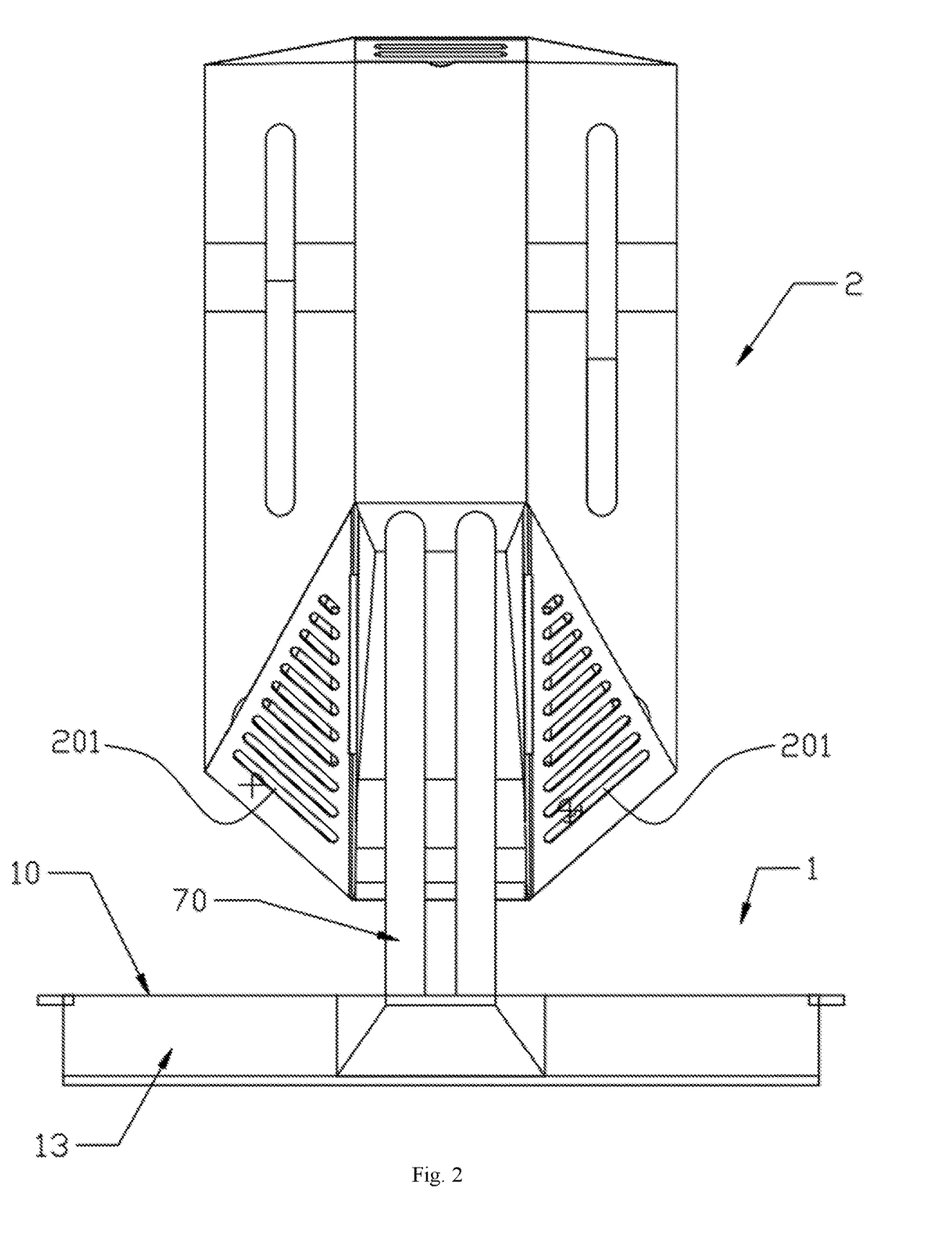
FIG. 2 is a rear view of the heat dissipating device shown in FIG. 1.

In the present embodiment, the heat dissipating device may further include a heat dissipating main body 2 connected to the base 1. The heat dissipating main body 2 may include a housing 20, which may preferably be made of a metal with good thermal conductivity, e.g. copper, copper alloy, aluminum, aluminum alloy or other metallic or alloy materials. Of course, the housing 20 may also be made of a non-metallic material. A hook may be disposed on the housing 20. When the heat dissipating device is used with a laptop, during operation, a display screen of the laptop is erected, and the housing 20 may be hung on the case of the display screen. The hook may be slidable and disposed on the housing 20. Referring to FIG. 1, the hook may be disposed on a slide rail 203 on a vertical side of the housing 20. The hook may be slid along the slide rail 203 for adjustment of the position of the hook, so as to adapt to different types of laptop. Of course, it should be understood that the housing 20 may also be attached to the case of the display screen through other suitable means, e.g. a suction cup or other conventionally applicable structures. When being used with other electronic products, the housing 20 may be supported by a foldable frame in order to allow the housing 20 to be erected.

Figure 6A:
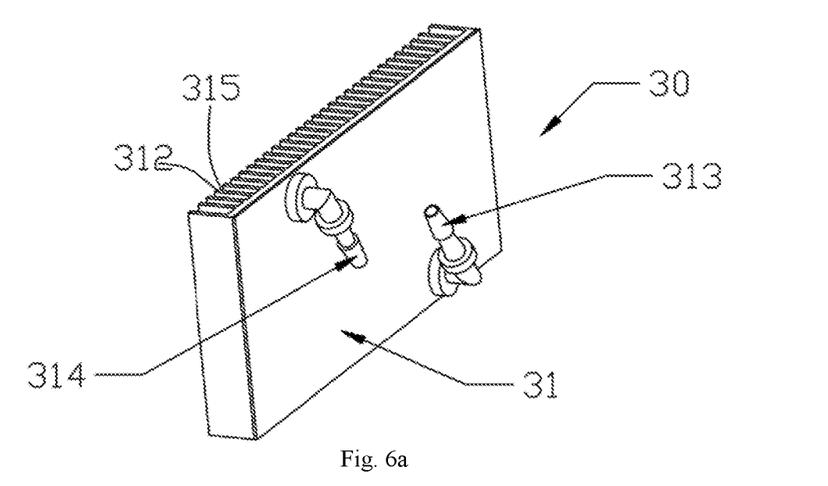
FIG. 6a is a three-dimensional schematic view of the first heat dissipator in an embodiment of the heat dissipating device according to the present application.
Figure 6B:
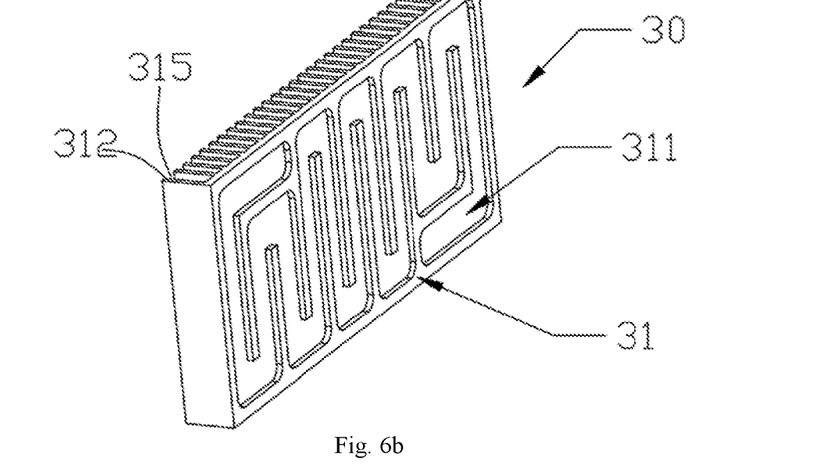
Figure 8:
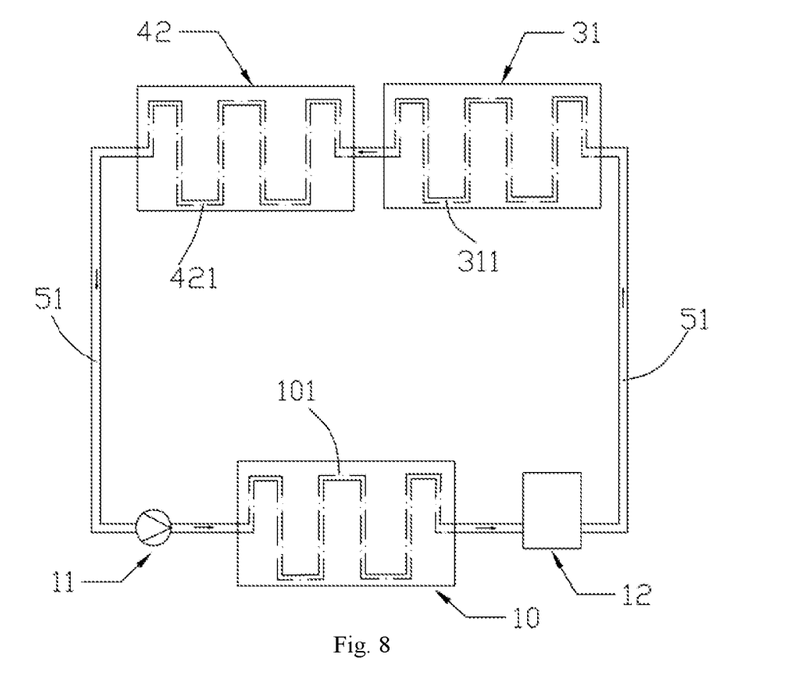
FIG. 8 is a schematic view of the cooling medium circulation loop of the heat dissipating device shown in FIG. 1.

In the present embodiment, a first heat dissipator 30 and a heat dissipating fan 60 may be disposed within the housing 20. Referring to FIGS. 6a, 6b and 8, the first heat dissipator 30 may include a first heat dissipating substrate 31. A first heat dissipating flow channel 311 for the cooling medium to flow through may be disposed within the first heat dissipating substrate 31. A first inlet 313 and a first outlet 314, in connection with two ends of the first heat dissipating flow channel 311, respectively, may be disposed on the first heat dissipating substrate 31. When the cooling medium flows through the first heat dissipating substrate 31, it flows in via the first inlet 313, flows through the first heating dissipating flow channel 311, and flows out via the first outlet 314. The heat absorbing plate flow channel 101 and the first heat dissipating flow channel 311 may be connected via pipes 51 and form a cooling medium circulation loop. A fluid pump 11 may be disposed in the cooling medium circulation loop, which provides force for circulating the cooling medium in the cooling medium circulating loop. The fluid pump 11 may be a conventional electric pump. Heat dissipating fins 312 may be formed on one side of the first heat dissipating substrate 31. The gap between the heat dissipating fins 312 may form a first air passage 315. An air inlet 201 and an air outlet 202 may be formed on the housing 20. The heat dissipating fan 60 may be used for drawing air into the housing 20 via the air inlet 201, so as to allow the air drawn in to flow through the first air passage 315, perform heat exchange with the heat dissipating fins 312, and be subsequently emitted via the air outlet 202. This may carry away the heat of the heat dissipating fins 312 and increase the heat dissipating efficiency. In order to prevent dust from accumulating inside the housing 20, a filter element, e.g. a primary cotton air filter, may be disposed at the air inlet 201 to filter out the dust in the air, and ensure that the inside of the housing 20 is clean. The filter element may be periodically replaced or washed.

Referring to FIGS. 4, 7a to 7c and 8, in the present embodiment, the heat dissipating main body 2 may further include a second heat dissipator 40 disposed within the housing 20 and above the first heat dissipator 30. The second heat dissipator 40 may include a solid-state refrigerating member 41 and a cooling plate 42 disposed at the cool terminal 411 of the solid-state refrigerating member 41. A cooling plate flow channel 421 for the cooling medium to flow through may be disposed within the cooling plate 42. A second inlet 422 and a second outlet 423, in connection with the cooling plate flow channel 421, respectively, may be disposed on the cooling plate 42. When the cooling medium flows through the cooling pate 421, it flows in via the second inlet 422, flows through the cooling plate flow channel 421, and flows out via the second outlet 423. The cooling plate flow channel 421 may be part of the cooling medium circulation loop, and connected to the cooling medium circulation loop via the pipes 51.

Referring to FIG. 8, in the present embodiment, the cooling medium circulation loop may be formed by the heat absorbing plate flow channel 101, the first heat dissipating flow channel 311, the cooling plate flow channel 421, the fluid pump 11, and the pipes 51. Specifically, the cooling medium outlet 103 of the heat absorbing plate 10 may be connected, via the pipes 51, with the first inlet 313 of the first heat dissipating substrate 31. The first outlet 314 of the first heat dissipating substrate 31 may be connected, via the pipes 51, with the second inlet 422 of the cooling plate 42. The second outlet 423 of the cooling plate 42 may be connected, via the pipes 51, with an inlet of the fluid pump 11. The outlet of the fluid pump 11 may be connected, via the pipes 51, with the cooling medium inlet 102 of the heat absorbing plate 10. During operation of the heat dissipating device, upon being cooled by the cooling plate 42, the cooling medium enters the heat absorbing plate flow channel 101 of the heat absorbing plate 10 under the action of the fluid pump 11. After performing heat exchange with the heat absorbing plate 10, the temperature of the cooling medium is increased. Then, the cooling medium enters the first heat dissipating flow channel 311 of the first heat dissipating substrate 31, and performs heat exchange with the first heat dissipating substrate 31. Upon passing through the first heat dissipating flow channel 311, the temperature of the cooling medium is reduced. Afterward, the cooling medium enters the cooling plate flow channel 421 of the cooling plate 42 and further performs heat exchange with the cooling plate 42. Since the cooling plate 42 is in contact with the cool terminal 411 of the solid-state refrigerating member 41, the temperature of the cooling plate 42 is relatively low. The cooling medium flowing through the cooling plate 42 is further cooled and then pumped into the heat absorbing plate 10 by the fluid pump 11 to reduce the temperature of the heat absorbing plate 10.

Figure 3:
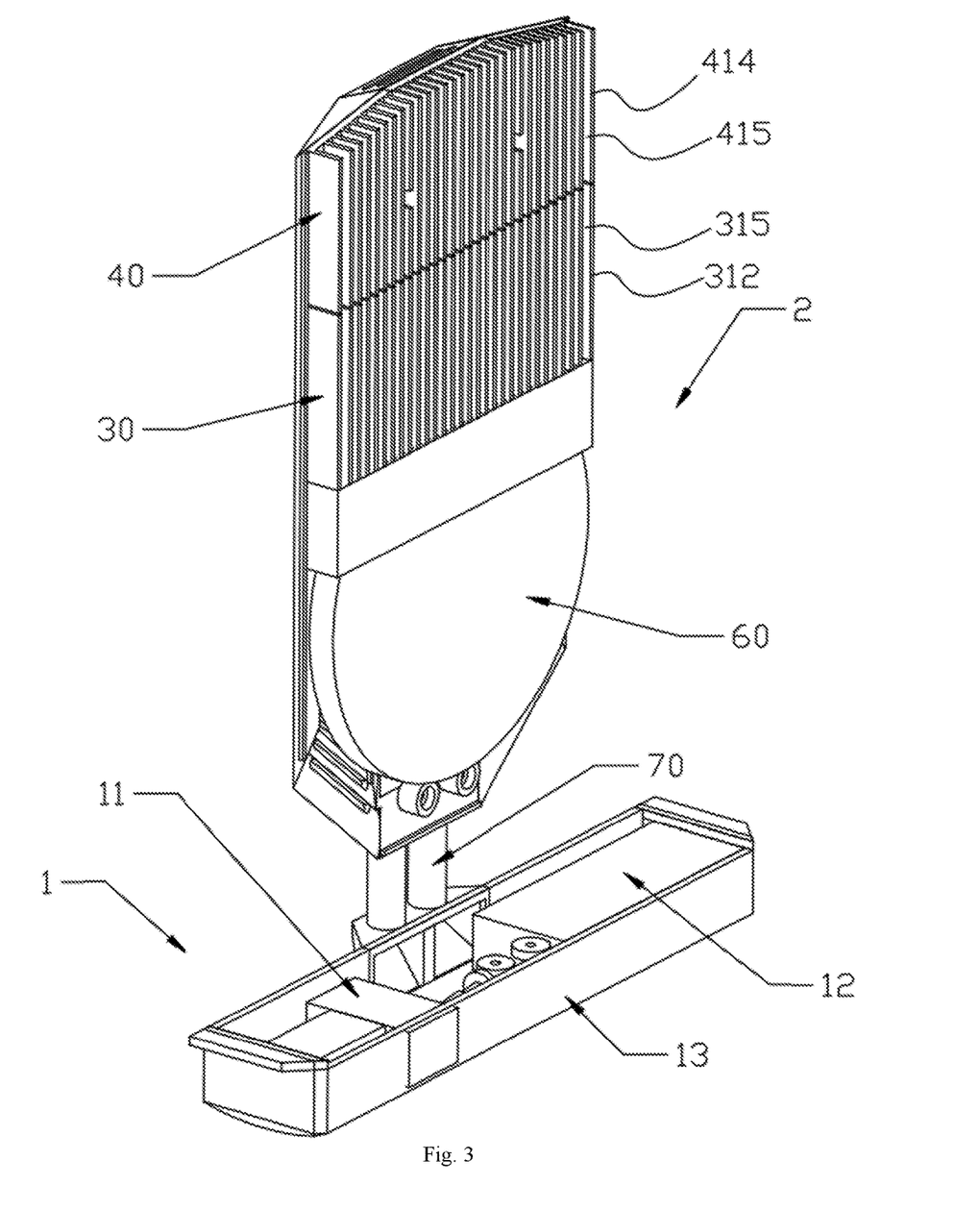
FIG. 3 is a schematic view of the internal structure of the heat dissipating device shown in FIG. 1.
Figure 4:
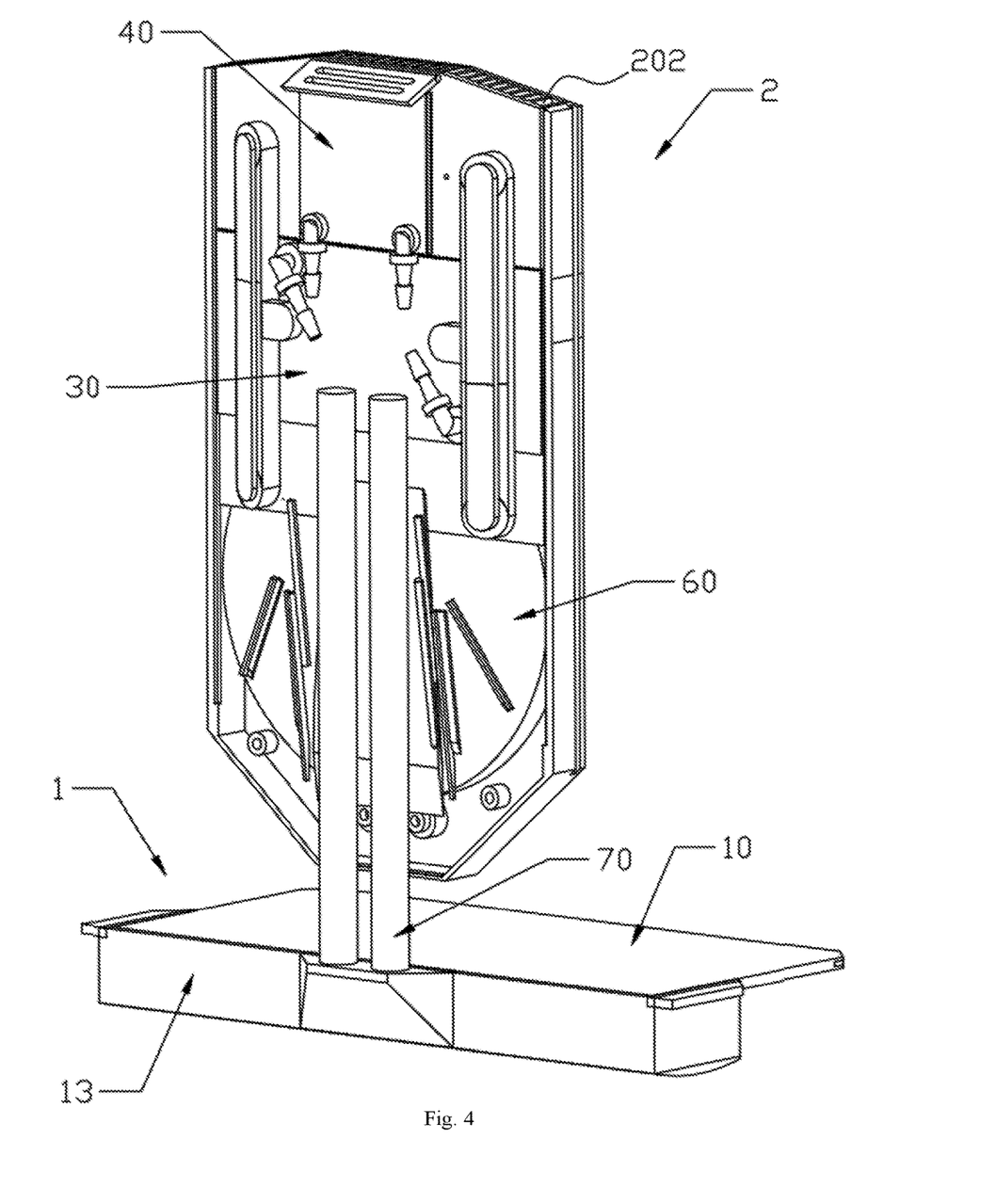
FIG. 4 is another schematic view of the internal structure of the heat dissipating device shown in FIG. 1.
Figure 5:
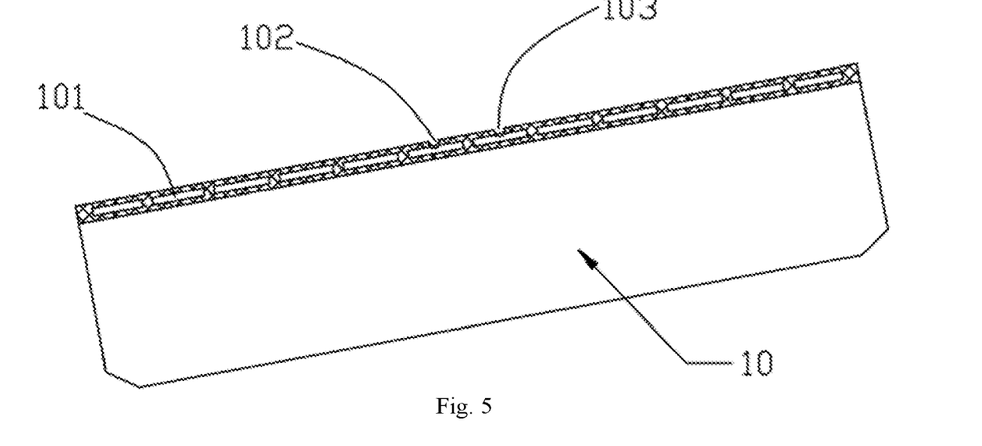
FIG. 5 is a schematic view of the heat absorbing plate in an embodiment of the heat dissipating device according to the present application.

Referring to FIGS. 3 and 8, in the present embodiment, a container 12 for accommodating the cooling medium may be further disposed in the cooling medium circulation loop. The container 12 may exert a buffering effect in the cooling medium circulation loop. When the cooling medium is subjected to thermal expansion or the pressure becomes excessive, the container 12 may provide room for buffering and avoid excessive pressure on the cooling medium circulation loop. In the present embodiment, the fluid pump 11 and the container 12 may be disposed within the bottom case 13 of the base 1. Of course, it should be understood that the fluid pump 11 and the container 12 may also be disposed within the housing 20 of the heat dissipating main body 2, or may also be disposed within the bottom case 13 and the housing 20, respectively.

Figure 7A:
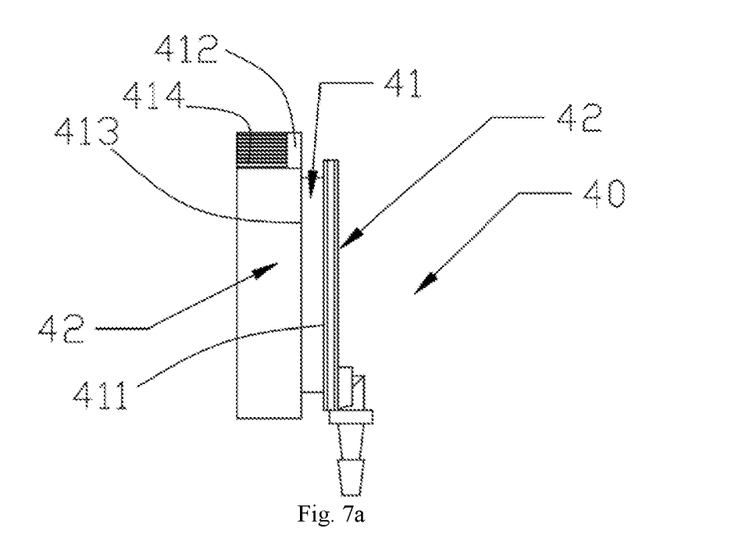
FIG. 7a is a schematic side view of the second heat dissipator in an embodiment of the heat dissipating device according to the present application.
Figure 7B:
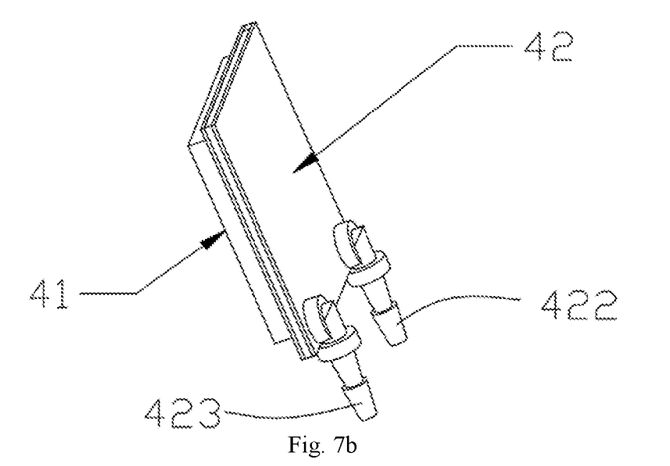
Figure 7C:
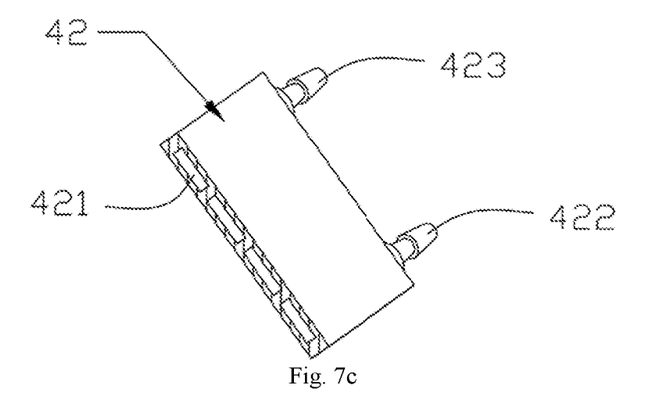

Referring to FIG. 7a, the second heat dissipator 40 may further include a second heat dissipating substrate 412 disposed at the hot terminal 413 of the solid-state refrigerating member 41. One side of the second heat dissipating substrate 412, which is distal from the hot terminal 413 of the solid-state refrigerating member 41, may include heat dissipating fins 414. The gap between the heat dissipating fins 414 may form a second air passage 415. The first air passage 315 of the first heat dissipator 30 may be connected with the second air passage 415. Air which is drawn into the housing 20 by the heat dissipating fan 60 may flow through the first air passage 315, enter the second air passage 415, and be emitted via the air outlet 202.

Referring to FIGS. 1-4, in the present embodiment, the base 1 may be connected with the heat dissipating main body 2 via a conduit 70. The pipes 51 connecting the heat absorbing plate flow channel 101 and the first heat dissipating flow channel 311, and electric wires of the heat dissipating fan 60 and the solid-state refrigerating member 41 within the heat dissipating main body 2 may be disposed within the duct 70.

The solid-state refrigerating member 41 in the present application may be a semiconductor refrigerating member, a refrigerating member based on magnetocaloric effect, a refrigerating member based on thermoelectric effect, or other solid-state refrigerating members that are capable of providing a refrigerating effect. During operation, a temperature difference is generated by the two sides of the solid-state refrigerating member 41. The side with a lower temperature (i.e., the cool terminal 411) may absorb heat from the cooling plate 42, which is in contact with the side with a lower temperature, so as to reduce the temperature of the cooling plate 42, thereby reducing the temperature of the cooling medium flowing through the cooling plate 42. The side with a higher temperature (i.e., the hot terminal 413) may transfer heat to the second heat dissipating substrate 412, which is in contact with the side with a higher temperature, and dissipate heat outwardly via the heat dissipating fins 414. Of course, it should be understood that the side with a higher temperature may also dissipate heat to the surroundings directly.

In the present embodiment, the base 1 may be used for absorbing heat generated by the electronic product placed on the heat absorbing plate 10 so as to cool the electronic product. The heat dissipating main body 2 may be used for dissipating heat and cooling the cooling medium in the cooling medium circulation loop. The structure, in which the base 1 and the heat dissipating main body 2 are separated, may allow a higher heat dissipating efficiency and improve the user experience.

Figure 9:
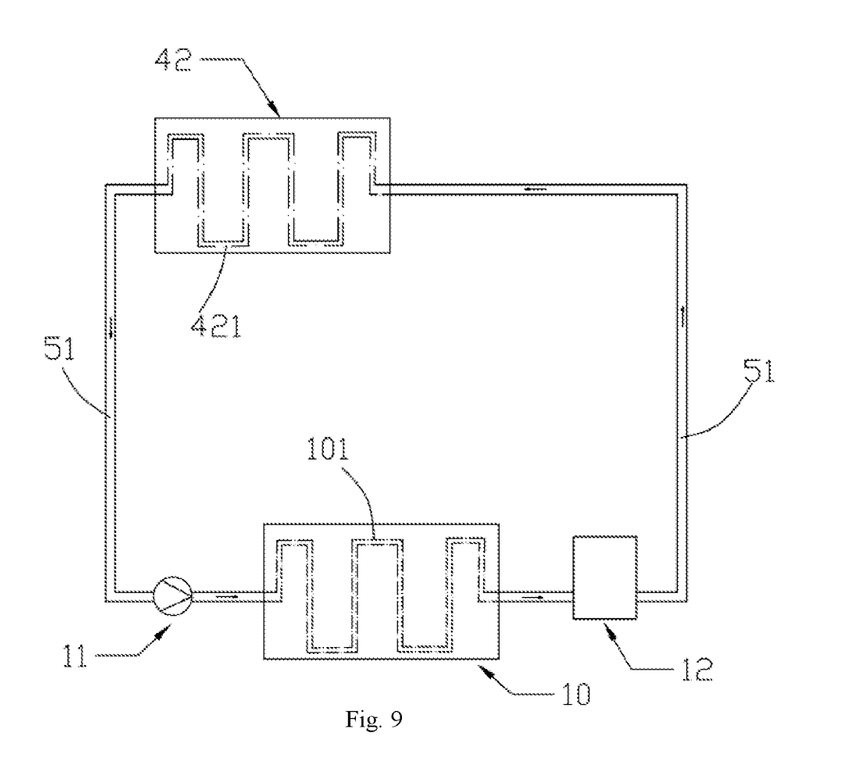
FIG. 9 is a schematic view of the cooling medium circulation loop according to another embodiment of the present application.

In another embodiment of the heat dissipating device according to the present application, the first heat dissipator 30 in the first embodiment may be omitted. The cooling plate flow channel 421 of the cooling plate 42 of the second heat dissipator 40 and the heat absorbing plate flow channel 101 of the heat absorbing plate 10 may form the cooling medium circulation loop. The cooling medium circulation loop in this embodiment is shown in FIG. 9. Alternatively, the heat dissipating main body 2 may only include the first heat dissipator 30. The first heat dissipator 30 may further include the solid-state refrigerating member. The cool terminal of the solid-state refrigerating member may be fitted with the first heat dissipating plate 31.

Figure 10:
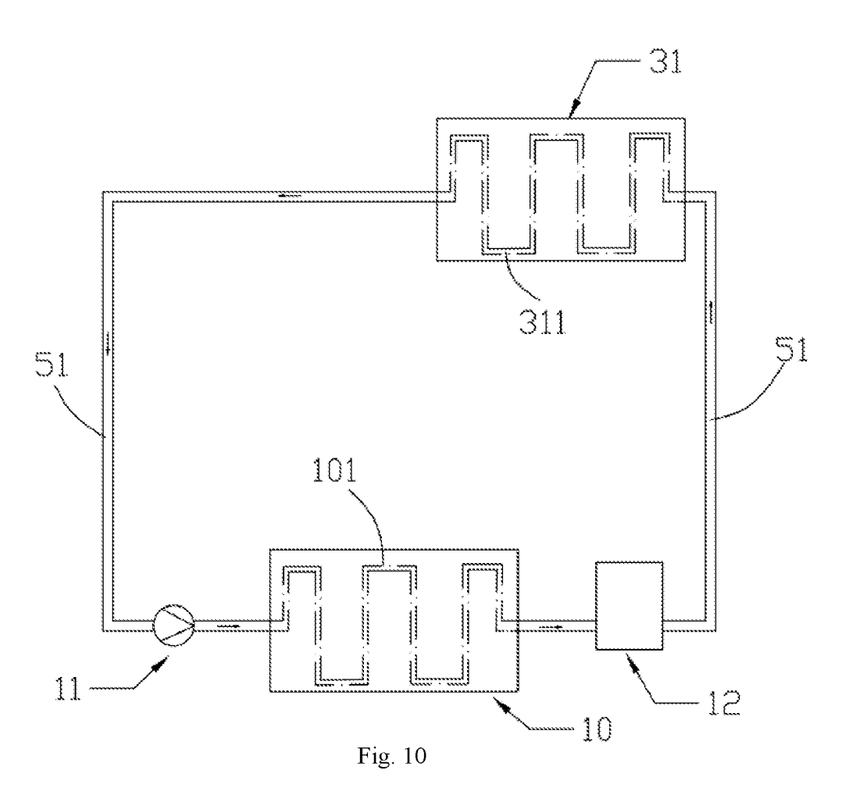
FIG. 10 is a schematic view of the cooling medium circulation loop according to yet another embodiment of the present application.

In still another embodiment of the heat dissipating device according to the present application, the second heat dissipator 40 in the first embodiment may be omitted. The first heat dissipating flow channel 311 of the first heat dissipating plate 31 of the first heat dissipator 30 and the heat absorbing plate flow channel 101 of the heat absorbing plate 10 may form the cooling medium circulation loop. The cooling medium circulation loop in this embodiment is shown in FIG. 10.

While the embodiments of the present application have been described with reference to the accompanying drawings, the present application is not limited to the specific embodiments described above. The specific embodiments described above are merely illustrative and not restrictive. It will be apparent to one skilled in the art that various changes may be made without departing from the gist of the present application and the scope as defined by the appended claims, which are within the scope of the present application.

What is claimed is:

1. A heat dissipating device, comprising:
a base comprising a heat absorbing plate; wherein the heat absorbing plate is made of a metallic material and is configured for an electronic product to be placed thereon; wherein a heat absorbing plate flow channel is disposed within the heat absorbing plate and is configured for a cooling medium to flow through, a cooling medium inlet and a cooling medium outlet which in connection with the heat absorbing plate flow channel respectively disposed on the heat absorbing plate;
a heat dissipating main body connected to the base; wherein the heat dissipating main body comprises a housing, and a first heat dissipator and a heat dissipating fan disposed within the housing; the first heat dissipator comprises a first heat dissipating substrate; a first heat dissipating flow channel, configured for the cooling medium to flow through, is disposed within the first heat dissipating substrate, a first inlet and a first outlet which in connection with two ends of the first heat dissipating flow channel respectively disposed on the first heat dissipating substrate;
wherein the heat absorbing plate flow channel and the first heat dissipating flow channel are connected via pipes and form a cooling medium circulation loop; and a fluid pump is disposed in the cooling medium circulation loop;
the heat dissipating main body further comprises a second heat dissipator disposed within the housing; the second heat dissipator comprises a solid-state refrigerating member, and a cooling plate disposed at a cool terminal of the solid-state refrigerating member; a cooling plate flow channel, configured for the cooling medium to flow through, is disposed within the cooling plate; and the cooling plate flow channel forms a part of the cooling medium circulation loop, a second inlet and a second outlet which in connection with the cooling plate flow channel respectively disposed on the cooling plate;
the cooling medium outlet of the heat absorbing plate connected with the first inlet of the first heat dissipating substrate via pipes, the first outlet of the first heat dissipating substrate connected with the second inlet of the cooling plate via pipes, the second outlet of the cooling plate connected with an inlet of the fluid pump via pipes, an outlet of the fluid pump connected with the cooling medium inlet of the heat absorbing plate via the pipes.

2. The heat dissipating device according to claim 1, wherein the second heat dissipator further comprises a second heat dissipating substrate disposed at a hot terminal of the solid-state refrigerating member; and a side of the second heat dissipating substrate, which is distal from the hot terminal of the solid-state refrigerating member, comprises heat dissipating fins.

3. The heat dissipating device according to claim 2, wherein the solid-state refrigerating member is a semiconductor refrigerating member, a refrigerating member based on magnetocaloric effect, or a refrigerating member based on thermoelectric effect.

4. The heat dissipating device according to claim 1, wherein heat dissipating fins are formed on a side of the first heat dissipating substrate.

5. The heat dissipating device according to claim 1, further comprising a solid-state refrigerating member; wherein a cool terminal of the solid-state refrigerating member is fitted with the first heat dissipating plate substrate.

6. The heat dissipating device according to claim 1, wherein a container is disposed in the cooling medium circulation loop, and the container is configured for accommodating the cooling medium.

7. The heat dissipating device according to claim 6, wherein the base further comprises a bottom case disposed beneath the hot absorbing plate; and the fluid pump and the container are disposed within the bottom case.

8. The heat dissipating device according to claim 1, wherein an air inlet and an air outlet are formed on the housing; and the heat dissipating fan is configured to draw in air via the air inlet and emit the air via the air outlet.

9. The heat dissipating device according to claim 1, wherein the base and the heat dissipating main body are connected via a conduit.

\* \* \* \* \*